United States Patent
Jin

(10) Patent No.: US 10,948,360 B2
(45) Date of Patent: Mar. 16, 2021

(54) SWITCHING ELEMENT HAVING TEMPERATURE MONITORING AND METHOD FOR TEMPERATURE MONITORING

(71) Applicant: Robert Bosch GmbH, Stuttgart (DE)

(72) Inventor: Jiahang Jin, Kornwestheim (DE)

(73) Assignee: Robert Bosch GmbH, Stuttgart (DE)

( * ) Notice: Subject to any disclaimer, the term of this patent is extended or adjusted under 35 U.S.C. 154(b) by 400 days.

(21) Appl. No.: 16/096,128

(22) PCT Filed: Mar. 9, 2017

(86) PCT No.: PCT/EP2017/055508
§ 371 (c)(1),
(2) Date: Oct. 24, 2018

(87) PCT Pub. No.: WO2017/186391
PCT Pub. Date: Nov. 2, 2017

(65) Prior Publication Data
US 2019/0137347 A1     May 9, 2019

(30) Foreign Application Priority Data
Apr. 29, 2016    (DE) ..................... 10 2016 207 381.8

(51) Int. Cl.
*G01K 7/01*     (2006.01)
*G01K 7/42*     (2006.01)
(Continued)

(52) U.S. Cl.
CPC ............. *G01K 7/427* (2013.01); *G01K 13/00* (2013.01); *H01L 29/7393* (2013.01); *H01L 2924/13055* (2013.01)

(58) Field of Classification Search
CPC .... H01L 2924/13055; H02M 7/53871; H02M 2001/327; H02M 1/08; H02M 2007/2195;
(Continued)

(56) References Cited

U.S. PATENT DOCUMENTS 6,583,976 B1 *  6/2003  Murahashi ........... H03K 17/122
                                                   361/100
7,607,827 B2 * 10/2009  Karikomi .............. G01K 7/425
                                                   361/93.8
(Continued)

FOREIGN PATENT DOCUMENTS

CN       101167251 A     4/2008
CN       201821255 U     5/2011
(Continued)

OTHER PUBLICATIONS

International Search Report for Application No. PCT/EP2017/055508 dated May 12, 2017 (English Translation, 2 pages).

*Primary Examiner* — Gail Kaplan Verbitsky
(74) *Attorney, Agent, or Firm* — Michael Best & Friedrich LLP

(57) ABSTRACT

The present invention relates to a temperature monitoring for switching elements, in particular for a module having bipolar transistors with an insulated gate. For this purpose, the current operating parameters of the IGBT module are detected and, on the basis of said operating parameters, an expected temperature of the switching element is determined at a predetermined position. Said expected temperature is compared with a temperature detected at this position. If the actual temperature exceeds the expected temperature, then this is an indication of a malfunction.

10 Claims, 3 Drawing Sheets

(51) Int. Cl.
*G01K 13/00* (2021.01)
*H01L 29/739* (2006.01)

(58) Field of Classification Search
CPC ....... H02M 7/537; G01K 13/00; G01K 1/026; G01K 7/01
See application file for complete search history.

(56) References Cited

U.S. PATENT DOCUMENTS

| | | | |
|---|---|---|---|
| 9,030,054 B2* | 5/2015 | Jacobson | H02M 1/08 307/115 |
| 9,515,584 B2* | 12/2016 | Koller | H02P 6/12 |
| 10,060,405 B2* | 8/2018 | Ishii | H01L 29/0638 |
| 10,191,021 B2* | 1/2019 | Singh | G01K 7/42 |
| 10,369,867 B2* | 8/2019 | Nagasaka | H02M 1/08 |
| 2009/0099791 A1 | 4/2009 | Zettel et al. | |
| 2014/0021974 A1 | 1/2014 | Suyama | |
| 2014/0226381 A1* | 8/2014 | Sasaki | H02P 27/08 363/97 |
| 2015/0211938 A1 | 7/2015 | Imakiire et al. | |
| 2020/0049569 A1* | 2/2020 | Arens | H01L 29/66992 |

FOREIGN PATENT DOCUMENTS

| | | |
|---|---|---|
| CN | 102301553 A | 12/2011 |
| CN | 203849637 U | 9/2014 |
| CN | 104303411 A | 1/2015 |
| CN | 105048408 A | 11/2015 |
| EP | 1724561 | 11/2006 |

\* cited by examiner

SWITCHING ELEMENT HAVING TEMPERATURE MONITORING AND METHOD FOR TEMPERATURE MONITORING

BACKGROUND OF THE INVENTION

The present invention relates to a switching element having temperature monitoring, a drive system having such a switching element, and a method for temperature monitoring. In particular, the present invention relates to temperature monitoring in a switching element having an IGBT module.

The publication EP 1 724 561 A2 discloses a temperature sensor for an IGBT module. Here, the IGBT module has a hole which is provided for attaching the IGBT module to a heat sink. A sensor element for temperature measurement is accommodated on a carrier element, and the carrier element has a shape for affixing the carrier element flush against the IGBT module.

For an electric drive, in particular in an electric or hybrid vehicle, three-phase machines are supplied with electric power via an inverter. In particular modules having semi-conductor switching elements, for example, bipolar transistors having an insulated gate terminal (IGBT), are used in the inverter. Since the current-carrying capacity of a single transistor in such a module is limited, multiple transistors may be connected in parallel in an IGBT module in order to increase the current-carrying capacity.

Furthermore, in electric drive systems, a switching state is generally provided, in which the system may be switched to a safe operating state. Such a safe switching state is, for example, an active short circuit, in which all phase terminals of a connected electric machine, for example, can be electrically connected, i.e., short-circuited, via the switching elements of the inverter. In the case of such an active short circuit, a relatively high current may possibly occur. The temperature of the IGBT module may be monitored by means of a temperature sensor.

SUMMARY OF THE INVENTION

The present invention discloses a switching element, a drive system, and a method for temperature monitoring.

Accordingly, the following is provided:

A switching element having temperature monitoring, including an IGBT module, a first temperature sensor, a second temperature sensor, a current sensor, and a monitoring device. The IGBT module comprises a first plurality of IGBT chips and a second plurality of IGBT chips. The collector terminals of the first plurality of IGBT chips are electrically coupled to a first terminal of the IGBT module. The emitter terminals of the first plurality of IGBT chips are electrically coupled to a node of the IGBT module. The collector terminals of the second plurality of IGBT chips are electrically coupled to the node of the IGBT module. The emitter terminals of the second plurality of IGBT chips are electrically coupled to the second terminal of the IGBT module. The first temperature sensor is designed to detect a chip temperature at a first predetermined position of the IGBT module. The second temperature sensor is designed to detect an ambient temperature in the vicinity of the IGBT module. The current sensor is designed to detect an electric current which flows into the IGBT module at the node of the IGBT module. The monitoring device is designed to ascertain a limit temperature, using the electric current detected via the current sensor and the ambient temperature detected via the second temperature sensor. Furthermore, the monitoring device is designed to compare the ascertained limit temperature to the chip temperature detected via the first temperature sensor. Based on the comparison of the limit temperature to the chip temperature, a malfunction may be detected in the IGBT module.

Furthermore, the following is provided:

A drive system including an electric machine having a plurality of phase terminals, and a rectifier including a switching element according to the present invention. In particular, the rectifier may include a switching element according to the present invention, for each phase terminal of the electric machine.

Furthermore, the following is provided:

A method for monitoring the temperature of an IGBT module. In this case, the IGBT module comprises a first plurality of IGBT chips and a second plurality of IGBT chips. Collector terminals of the first plurality of IGBT chips are electrically coupled to a first terminal of the IGBT module, and the emitter terminals of the first plurality of IGBT chips are electrically coupled to a node of the IGBT module. The collector terminals of the second plurality of IGBT chips are electrically coupled to the node of the IGBT module, and the emitter terminals of the second plurality of IGBT chips are electrically coupled to a second terminal of the IGBT module. The method comprises the steps of detecting a chip temperature at a predetermined position of the IGBT module, detecting an ambient temperature in the vicinity of the IGBT module, and detecting an electric current which flows into the IGBT module at a node of the IGBT module. The method furthermore comprises a step for ascertaining a limit temperature. In this case, the limit temperature is ascertained using the detected electric current and the detected ambient temperature. Furthermore, the method comprises a step for comparing the ascertained limit temperature to the detected chip temperature, and a step for detecting a malfunction of the IGBT module, if the detected chip temperature exceeds the ascertained limit temperature.

The present invention is based on the knowledge that in the case of the failure of an IGBT chip in an IGBT module having a plurality of IGBT chips connected in parallel, there may be an increase in the electric current flowing through the remaining intact IGBT chips. Furthermore, the present invention is based on the knowledge that such an increase in the electric current flowing through the IGBT chips may result in damage to the intact IGBT chips if the electric current exceeds a maximum allowable level.

It is therefore an idea of the present invention to take this knowledge into consideration, and to provide monitoring of switching elements via an IGBT module which is able to detect an overloading of individual IGBT chips in an IGBT module. In this case, the present invention is based on the idea of detecting the temperature at such an IGBT module, and comparing the actual temperature at the IGBT module to a theoretical expected value. In order to determine this theoretical expected value for the temperature at the IGBT module, a temperature model may be created. For example, parameters such as the ambient temperature, the current load of the IGBT module, and optionally the temperature of a coolant may, for example, be incorporated into this temperature model. In this case, the theoretical expected value for the temperature of the IGBT module at the position of the temperature sensor may be ascertained in particular based on a set of characteristic curves and/or a plurality of individual characteristic curves. As a result, the expected temperature at the IGBT module may be ascertained in a very simple manner, without complex computing effort.

By comparing the actual temperature at the IGBT module to a theoretical expected value, a disproportionate temperature increase may be detected in a very simple manner. Such a temperature increase may, for example, be an indication of a fault state of the IGBT module. For example, in such a fault state, a disproportionately large electric current may flow in individual IGBT chips of the IGBT module, which results in a correspondingly disproportionate temperature increase. By means of the temperature monitoring according to the present invention, such a disproportionately large temperature increase may be detected early. As a result, it is possible to introduce countermeasures before additional, possibly heavy damage is able to occur due to a thermal event.

According one embodiment, the IGBT module comprises a cooling device. This cooling device may be cooled by means of a fluid. In this case, the cooling device comprises a third temperature sensor. This third temperature sensor is designed to detect a coolant temperature of the fluid. In this case, the monitoring device may be designed to ascertain the limit temperature, additionally using the detected coolant temperature. Thus, the limit temperature is ascertained based on at least the detected electric current, the detected ambient temperature, and the detected coolant temperature. Thus, a disproportionately large temperature increase may be detected early, even in the case of active cooling of an IGBT module.

According to another embodiment, the monitoring device comprises a memory. The memory is designed to store a predetermined set of characteristic curves for the limit temperature to be ascertained. This set of characteristic curves may specify the relationship between the limit temperature to be ascertained and the detected parameters, in particular electric current flowing into the IGBT module, ambient temperature, and optionally coolant temperature. If additional parameters are to be incorporated into the ascertainment of the limit temperature, they may also be defined via the stored set of characteristic curves. In this case, the set of characteristic curves may be previously determined by means of theoretical simulation and/or by means of detection of measured values, and stored in the memory device. The memory device may be any nonvolatile memory. Thus, the limit temperature may be ascertained in a particularly simple manner.

According to another embodiment, the monitoring device is designed to calculate the limit temperature, based on a predetermined function stored in the monitoring device. Optionally, multiple alternative functions for specifying the limit temperature may also be stored. Thus, a memory-efficient method for ascertaining the limit temperature may be achieved.

According to another embodiment, the monitoring device is designed to carry out the ascertainment of the limit temperature and the comparison of the ascertained limit temperature to the chip temperature only if an electric machine which is connected to the node of the IGBT module is in a predetermined operating state. For example, the monitoring device may be designed to carry out the temperature monitoring according to the present invention only if a connected electric machine is in an active short circuit.

According to another embodiment, the monitoring device is designed to ascertain the limit temperature, using the switching states of the IGBT chips in the IGBT module. In particular, in the case of an active short circuit for a connected electric machine, the monitoring device may distinguish whether the active short circuit is produced by means of the first plurality of IGBT chips or the second plurality of IGBT chips. Thus, an individual limit temperature may be ascertained in each case for a so-called upper active short circuit and a so-called lower active short circuit.

According to one embodiment of the drive system, the drive system comprises a control device. The control device is designed to short-circuit the phase terminals of the connected electric machine, and thus to set an active short circuit, by controlling the rectifier. In particular, an upper short circuit may be set, for example, by controlling the first plurality of IGBT chips in the IGBT module. Alternatively, a lower short circuit may be set by controlling the second plurality of IGBT chips in the IGBT module. In this case, the monitoring device may be designed to carry out the ascertainment of the limit temperature and the comparison of the ascertained limit temperature to the chip temperature only if the phase terminals of the electric machine are short-circuited. In this case, during the ascertainment of the limit temperature, it may optionally be possible to distinguish between a short circuit by means of the first plurality of IGBT chips and a short circuit by means of the second plurality of IGBT chips.

According to one embodiment of the method for temperature monitoring, the method comprises a step for detecting a coolant temperature of a fluid via which the IGBT module is cooled. In this case, in the step for ascertaining the limit temperature, the limit temperature is furthermore ascertained using the detected coolant temperature. The limit temperature is thus ascertained using at least the current flowing into the IGBT module, the ambient temperature, and the coolant temperature.

According to another embodiment, the limit temperature is ascertained using a previously determined set of characteristic curves.

According to another embodiment, in the step of ascertaining the limit temperature, the limit temperature is taken into consideration, taking into account the switching states of the IGBT chips in the IGBT module. In particular, for example, for ascertaining the limit temperature, a distinction between control for an upper active short circuit and a lower active short circuit may be taken into consideration. In the case of an upper active short circuit, for example, all switching elements of the first plurality of IGBT chips are controlled, whereas in a lower short circuit, all IGBT chips of the second plurality of IGBT chips are controlled.

The embodiments and refinements mentioned above may be combined in any arbitrary manner if expedient. Additional embodiments, refinements, and implementations of the present invention also comprise combinations, which are not explicitly mentioned, of features of the present invention which have been previously described or are described below with respect to the exemplary embodiments. In particular, those skilled in the art will also add individual aspects as improvements or refinements to the respective basic form of the present invention.

BRIEF DESCRIPTION OF THE DRAWINGS

The present invention will be described in greater detail below based on the exemplary embodiments specified in the schematic figures of the drawings. The following are shown.

DETAILED DESCRIPTION

Figure 1:
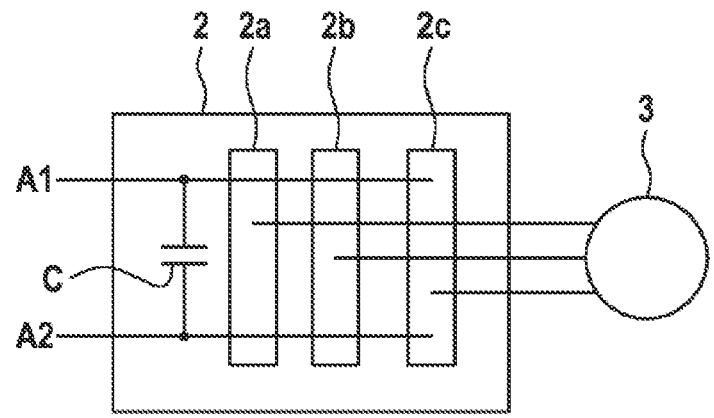
FIG. 1: a schematic representation of a drive system including an inverter according to one embodiment.

In all figures, identical or functionally identical elements and devices have been provided with identical reference characters, unless specified otherwise.

FIG. 1 shows a schematic representation of a block diagram of an electric drive system. Here, an inverter 2 is supplied with a DC voltage at the DC voltage terminals A1 and A2. In addition to an intermediate-circuit capacitor C, the inverter 2 comprises three bridge arms 2a, 2b, 2c. However, the number depicted here of three bridge arms serves merely to facilitate understanding, and does not constitute a limitation. Each bridge arm 2a, 2b, 2c may, for example, be implemented by means of an IGBT module 1. Optionally, multiple IGBT modules may also be arranged in parallel. At the output of the inverter 2, each phase terminal of the electric machine 3 is electrically connected to a bridge arm 2a, 2b, 2c.

Figure 2:
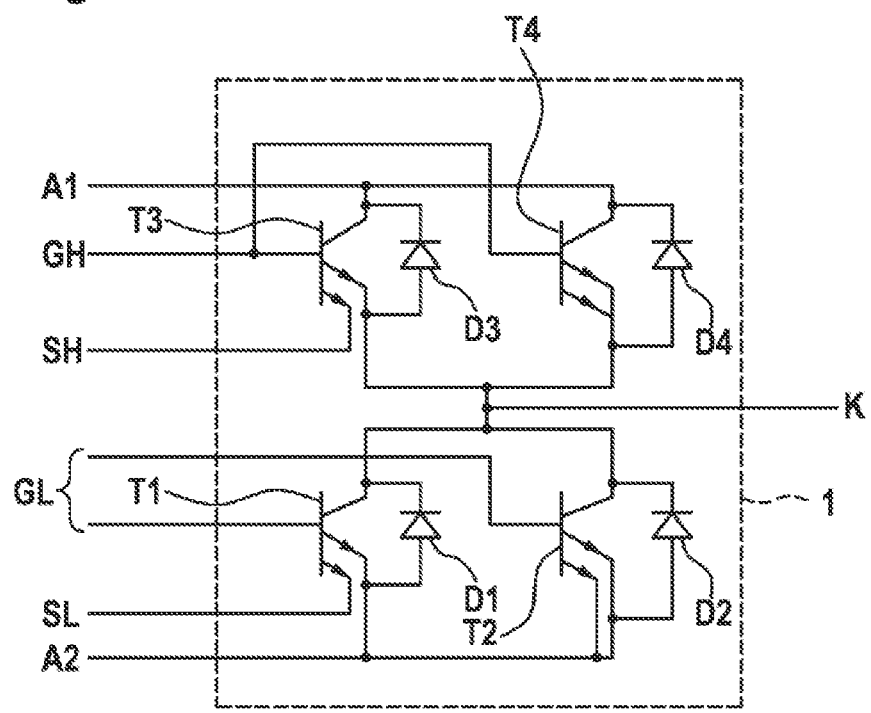
FIG. 2: a schematic representation of an IGBT module for a switching element according to one embodiment.

FIG. 2 shows a schematic representation of an IGBT module 1, as it, for example, may be used in a bridge arm 2a, 2b, 2c of the drive system from FIG. 1. An IGBT module 1 may have multiple IGBT chips arranged in parallel, for example, between an upper connecting point A1 and a node K. For example, as shown in FIG. 2, two IGBT chips may be arranged in parallel. However, it is also possible to connect more than two IGBT chips in parallel. For example, three, four, five, or more IGBT chips may also be arranged in parallel. In this case, each IGBT chip comprises a bipolar transistor having an insulated gate terminal. The collector terminals of the two transistors T4 and T3 of the two IGBT chips are each electrically connected to the upper terminal A1 of the IGBT module 1. The emitter terminals of the two transistors T4 and T3 of the IGBT chips are electrically connected to the node K of the IGBT module 1. In addition, the gate terminals are also routed jointly out of the IGBT module 1 at an upper gate terminal GH. Optionally, for detecting the electric current flowing through a transistor T4 of an IGBT chip, a so-called sense terminal SH of the transistor T3 may also be routed outwards.

Similarly, multiple IGBT chips are provided between the node K and the lower terminal A2 of the IGBT module 1. Here as well, the depicted number of two IGBT chips is to be understood to be merely exemplary. Generally, an equal number of IGBT chips are provided between the upper connecting point A1 and the node K, as between the node K and the lower connecting point A2. The collector terminals of the lower transistors T1 and T2 are electrically connected to the node K. The emitter terminals of the lower transistors T1 and T2 are electrically connected to the lower terminal A2. The gate terminals GL of the two lower transistors T1 and T2 may be routed jointly or separately out of the IGBT module 1. A sense terminal SL of a lower transistor T1 may also be routed outwards for detecting an electric current flowing through the corresponding transistor.

A diode D1 to D4 may be provided in parallel with each transistor T1 to T4 of the individual IGBT chips.

Figure 3:
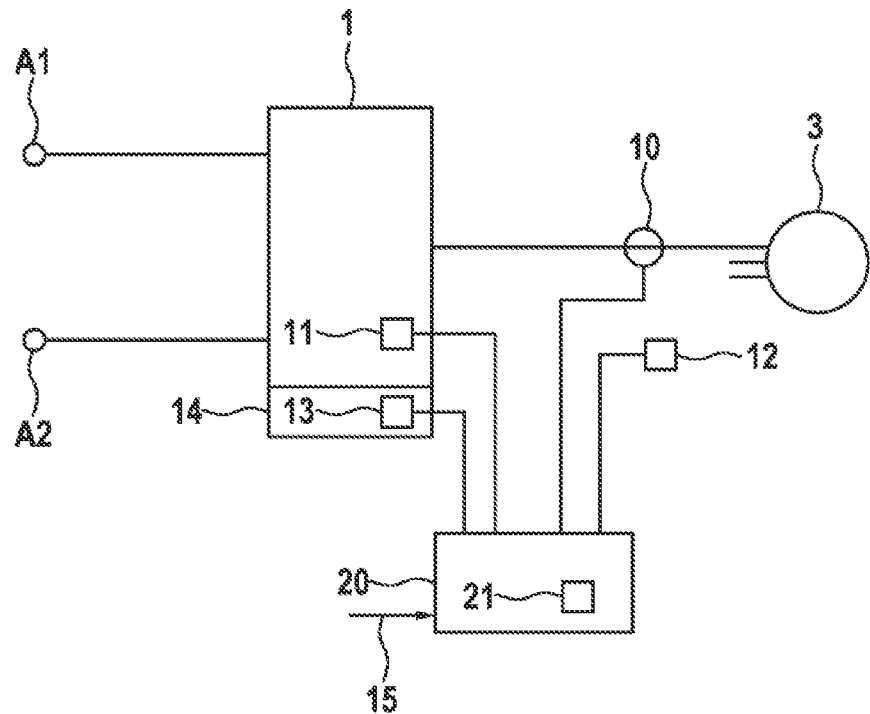
FIG. 3: a schematic representation of a switching element including temperature monitoring according to one embodiment.

FIG. 3 shows a schematic representation of a switching element including temperature monitoring according to one embodiment. Here, the switching element comprises an IGBT module 1, for example, an IGBT module 1 which is described in conjunction with FIG. 2. Between the first terminal A1 and the node K, a first plurality of IGBT chips is arranged in parallel. Between the node K and the second terminal A2 of the IGBT module 1, a second plurality of IGBT chips is provided in parallel. A current sensor 10 detects the electric current flowing between the node K and a phase terminal of the electric machine 3. This current sensor 10 may be any current sensor which provides an analog or digital output signal corresponding to the detected electric current. This output signal corresponding to the electric current is provided to the monitoring device 20. Furthermore, a first temperature sensor 11 is provided at the IGBT module 1. This first temperature sensor 11 is arranged at a known, predetermined position at the IGBT module 1. The first temperature sensor 11 detects the temperature at this predetermined position of the IGBT module 1 and provides an output signal corresponding to this detected temperature. This output signal may be any analog or digital output signal which corresponds to the temperature detected via the first temperature sensor 11. This output signal is also provided to the monitoring device 20. The first temperature sensor 11 may be integrated into the IGBT module 1, or the first temperature sensor 11 may be screwed onto the IGBT module 1, glued to the IGBT module 1, or connected in another manner.

Furthermore, the ambient temperature in the vicinity of the IGBT module 1 is detected via a second temperature sensor 12. In this case, in particular, the second temperature sensor detects a temperature at a position which is spaced away from the IGBT module 1. The second temperature sensor 12 then provides an analog or digital output signal which corresponds to the detected ambient temperature and which is provided to the monitoring device 20. Furthermore, the IGBT module 1 may be thermally coupled to a cooling device 14 in order to cool the IGBT module 1. For example, a fluid may flow through this cooling device 14. This fluid may be any liquid or gaseous substance. For example, cooling by means of water or the like is possible. The temperature of the coolant which flows through the cooling device 14 may be detected by means of a third temperature sensor 13. The third temperature sensor 13 then provides an analog or digital output signal which corresponds to the detected coolant temperature. This output signal is also provided to the monitoring device 20. Furthermore, a piece of information about the control signals for controlling the individual transistors in the IGBT chips of the IGBT module 1 may be provided to the monitoring device 20.

The monitoring device 20 receives the output signal of the current sensor 10 and the connected temperature sensors 11 to 13, as well as the piece of information about the control signals of the IGBT chips in the IGBT module 1. Optionally, additional information may also be provided to the monitoring device 20 and evaluated by it. From this information, the monitoring device 20 determines an expected temperature at the IGBT chip 1. In particular, via the monitoring device 20, a maximum temperature is determined which will occur at the position at which the first temperature sensor 11 is arranged. For this purpose, the electric current between the node K and the phase terminal of the electric machine 3, the ambient temperature, and optionally, the coolant temperature and the piece of information about the control signals of the IGBT chips in the IGBT module 1, may be taken into consideration. Based on the control signals 15 for the IGBT chips in the IGBT module 1, it is possible to determine which IGBT chips the electric current is to flow through. In addition, if the ambient temperature and optionally the coolant temperature are known, the steady-state temperature at the position of the first temperature sensor 11 may thereby be determined, taking into consideration the spacing of the individual IGBT chips from the first temperature sensor 11 at the IGBT module 1. A calculation of the steady-state temperature may, for example, be calculated based on the thermodynamic fundamentals known to those skilled in the art. For example, having knowledge of the geometric configuration of the IGBT module 1 and the arrangement of the IGBT module 1 on the cooling device 14, a mathematical formula for calculating the steady-state temperature may be determined. However, it is alternatively also possible to determine the steady-state temperatures at the first temperature sensor 11 in advance, by means of theoretical simulation or practical measurements, for example, under laboratory conditions. These temperatures determined in advance may then be stored in a suitable manner in a memory 21 of the monitoring device 20. For example, the relationships between the steady-state temperature at the position of the first temperature sensor 11 and the electric current detected by the current sensor 10, the ambient temperature, the control signals 15 of the IGBT chips, and optionally the coolant temperature, may be stored in the memory 21 of the monitoring device 20 in the form of a multidimensional set of characteristic curves or multiple sets of characteristic curves. The monitoring device 20 may thus ascertain the expected temperature at the position of the first temperature sensor 11 at the IGBT module 1 in a simple manner. Optionally, an interpolation between multiple points of the set of characteristic curves stored in the memory 21 may also be carried out here for a precise determination of the temperature.

After a temperature which has been ascertained at the position of the first temperature sensor 11 on the IGBT module 1 has been determined via the monitoring device 20, this ascertained temperature may be compared to the actual temperature detected via the first temperature sensor 11. If the temperature detected via the first temperature sensor 11 exceeds the expected temperature, this may indicate a possible fault within the IGBT module 1. Optionally, an additional threshold value may be added for compensating for disturbances and/or measurement tolerances for the expected temperature at the position of the first temperature sensor 11, and this sum may be used for the additional evaluation. Alternatively, a fault in the IGBT module 1 may also be detected only if the temperature detected by the first temperature sensor 11 exceeds the ascertained expected temperature value by more than a predetermined threshold value. If, as previously described, the temperature detected via the first temperature sensor 11 exceeds the expected temperature, or if the detected temperature exceeds the expected temperature by more than a threshold value, a fault is detected in the IGBT module 1. A fault message may then optionally be output by the monitoring device 20.

In the case of the detection of a fault in the IGBT module 1, additional measures may then be taken in order to avoid an additional temperature increase, and optionally to avoid damage due to a thermal event. For example, the control of the IGBT chips in the IGBT module 1 may be adjusted in order to set an alternative switching state.

For example, by controlling the IGBT chips in the IGBT module 1, the transistors in the IGBT chips may be controlled in such a way that the phase terminals of a connected electric machine 3 are short-circuited. As a result, an active short circuit (ASC) may be set. Such an active short circuit may alternatively be achieved either by closing the upper IGBT chips between the first connecting point A1 and the node K (upper ASC), or alternatively by closing the IGBT chips between the node K and the second connecting point A2 (lower ASC). For example, if an unacceptable temperature increase occurs during an upper ASC, a lower ASC could alternatively be set. Conversely, in the case of an unacceptable temperature increase of a lower ASC, an upper ASC may be set.

Since the maximum electric current flowing during an active short circuit corresponds to the rotational speed of the connected electric machine 3, in the case of detection of a temperature increase above the temperature value ascertained via the monitoring device 20, the maximum rotational speed of the electric machine 3 may also be limited during further operation. In particular, if the electric machine 3 is an electric machine which is coupled to the drive system of a hybrid vehicle or the like, the maximum rotational speed and thus the maximum speed may be limited, for example, when driving the hybrid vehicle by means of an internal combustion engine, in order to optionally limit the maximum current which occurs in the case of a required active short circuit.

Figure 4:
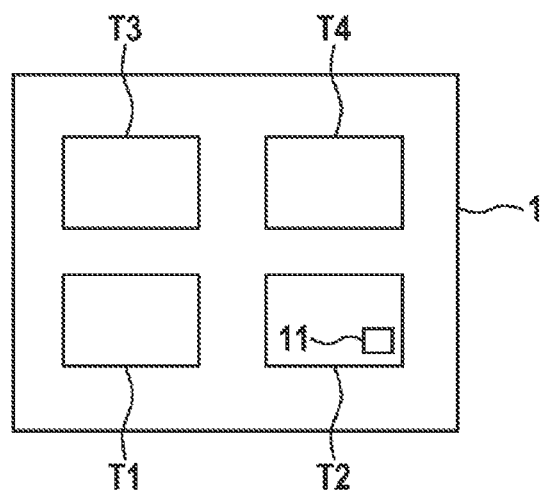
FIG. 4: a schematic representation of a top view onto an IGBT module for a switching element according to one embodiment.

FIG. 4 shows a schematic representation of a top view onto an IGBT module 1 including a first temperature sensor 11 according to one embodiment. As is apparent here, the individual IGBT chips including the four transistors T1 to T4 have different spacings from the first temperature sensor 11. Different maximum temperatures will therefore occur in thermodynamic equilibrium at the position of the first temperature sensor 11, depending on which of the transistors T1 to T4 of the IGBT chips an electric current will flow through. For this reason, the switching states or the control signals for the IGBT chips are also to be taken into consideration during the ascertainment of the expected temperature at the position of the temperature sensor 11.

Figure 5:
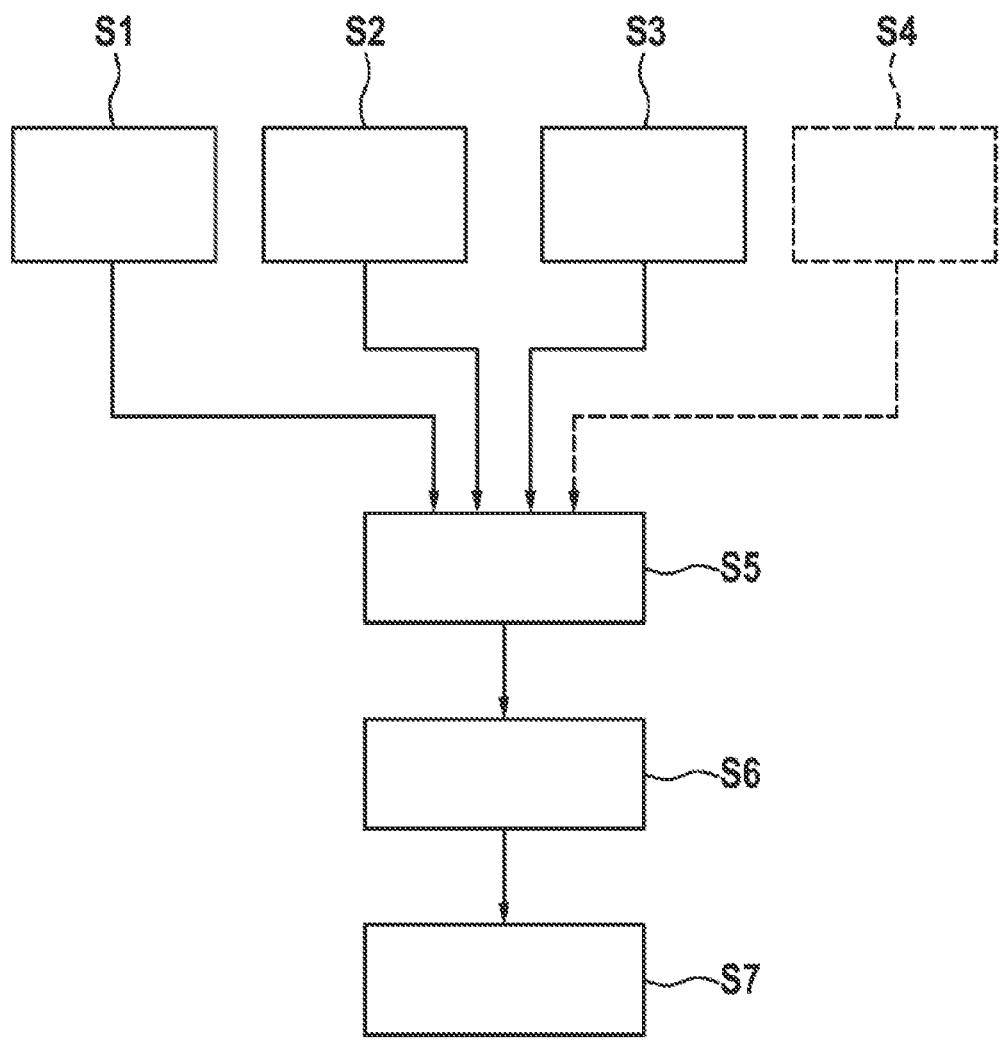
FIG. 5: a schematic representation of a flow chart, as based on a method according to one embodiment.

FIG. 5 shows a schematic representation of a flow chart based on a method for monitoring the temperature of an IGBT module 1. The IGBT module 1 may in particular be a previously described IGBT module 1 having a plurality of IGBT chips. In step S1, a chip temperature is determined at a predetermined position of the IGBT module 1. This chip temperature may, for example, be detected via a previously described first temperature sensor. In step S2, an ambient temperature in the vicinity of the IGBT module 1 is detected. This ambient temperature may, for example, be detected via the second temperature sensor 12. In a step S3, an electric current flowing into the IGBT module 1 at a node of the IGBT module 1 is detected. For example, this electric current may be detected by the current sensor 10. This detected electric current may, for example, be an electric current flowing between the node K and a phase terminal of a connected electric machine 3. In an additional step S4, a coolant temperature of a fluid which cools the IGBT module 1 may be detected, for example, by means of a third temperature sensor 13. In step S5, a limit temperature is ascertained using the detected parameters such as the detected electric current, the detected ambient temperature, and optionally the detected coolant temperature. In addition, when ascertaining the limit temperature, control signals for controlling the IGBT chips in the IGBT module 1 may also be taken into consideration. In step S6, the ascertained limit temperature is compared to the detected chip temperature, and subsequently in step S7, a malfunction of the IGBT module 1 detected if the detected chip temperature exceeds the ascertained limit temperature. Optionally, a malfunction of the IGBT module 1 may also be detected only if the detected chip temperature exceeds the ascertained limit temperature by more than a predetermined threshold value.

In the case of the detection of a malfunction, a fault message may be output. Optionally, the control signals for controlling the IGBT chips in the IGBT module 1 may then be adjusted, and/or a maximum rotational speed of an electric machine 3 which is connected to the IGBT module 1 may be limited to a predetermined maximum rotational speed.

In summary, the present invention relates to temperature monitoring for switching elements in particular for a module having bipolar transistors having an insulated gate. For this purpose, the current operating parameters of the IGBT module are determined, and based on these operating parameters, an expected temperature of the switching element at a predetermined position is determined. This expected temperature is compared to a temperature detected at this position. If the actual temperature exceeds the expected temperature, this is an indication of a malfunction.

The invention claimed is:

1. A switching element having temperature monitoring, the switching element comprising:
    an IGBT module (1) including a first plurality of IGBT chips and a second plurality of IGBT chips, wherein the collector terminals of the first plurality of IGBT chips are electrically coupled to a first terminal (A1) of the IGBT module (1), and the emitter terminals of the first plurality of IGBT chips are electrically coupled to a node (K), and wherein the collector terminals of the second plurality of IGBT chips are electrically coupled to the node (K), and the emitter terminals of the second plurality of IGBT chips are electrically coupled to a second terminal (A2) of the IGBT module (1);
    a first temperature sensor (11) which is designed to detect a chip temperature at a predetermined position of the IGBT module (1);
    a second temperature sensor (12) which is designed to detect an ambient temperature in the vicinity of the IGBT module (1);
    a current sensor (10) which is designed to detect an electric current which flows into the IGBT module (1) at the node (K) of the IGBT module (1); and
    a monitoring device (20) which is designed to
        ascertain a limit temperature, using the electric current detected via the current sensor (10) and the ambient temperature detected via the second temperature sensor (12), and
        to detect a malfunction of the IGBT module (1), based on a comparison of the ascertained limit temperature to the chip temperature detected via the first temperature sensor (11).

2. The switching element as claimed in claim 1, wherein the IGBT module (1) comprises a cooling device (14) which may be cooled by means of a fluid, wherein the cooling device (14) comprises a third temperature sensor (13) which is designed to detect a coolant temperature of the fluid; and
    wherein the monitoring device (20) is furthermore designed to ascertain the limit temperature, using the detected coolant temperature.

3. The switching element as claimed in claim 1 or 2, wherein the monitoring device (20) comprises a memory (21) which is designed to store a predetermined set of characteristic curves for the limit temperature to be ascertained, as a function of current flowing into the IGBT module and temperature.

4. The switching element as claimed in claim 1, wherein the monitoring device (20) is designed to calculate the limit temperature, based on a predetermined function which is stored in monitoring device (20).

5. The switching element as claimed in claim 1, wherein the monitoring device (20) is designed to carry out the ascertainments of the limit temperature and the comparison of the ascertained limit temperature to the chip temperature only if an electric machine (3) which is connected to the node (K) of the IGBT module (1) is in a predefined operating state.

6. A drive system, including:
    an electric machine (3) having a plurality of phase terminals;
    a rectifier (2) including a switching element as claimed in claim 1.

7. The drive system as claimed in claim 6, including a control device which is designed to short-circuit the phase terminals of an electric machine (3) by controlling the rectifier (2) in an active short circuit;
    wherein the monitoring device (20) is designed to carry out the ascertainment of the limit temperature and the comparison of the ascertained limit temperature to the chip temperature only if the phase terminals of the electric machine (3) are short-circuited.

8. A method for monitoring the temperature of an IGBT module (1) including a first plurality of IGBT chips and a second plurality of IGBT chips, wherein the collector terminals of the first plurality of IGBT chips are electrically coupled to a first terminal (A1) of the IGBT module (1), and the emitter terminals of the first plurality of IGBT chips are electrically coupled to a node (K), and wherein the collector terminals of the second plurality of IGBT chips are electrically coupled to the node (K), and the emitter terminals of the second plurality of IGBT chips are electrically coupled to a second terminal (A2) of the IGBT module (1), the method comprising:
    detecting (S1) a chip temperature at a predetermined position of the IGBT module (1);
    detecting (S2) an ambient temperature in the vicinity of the IGBT module (1);
    detecting (S3) an electric current which flows into the IGBT module (1) at the node (K) of the IGBT module (1);
    ascertaining (S5) a limit temperature, using the detected electric current and the detected ambient temperature;
    comparing (S6) the ascertained limit temperature to the detected chip temperature; and
    detecting (S7) a malfunction of the IGBT module (1) if the detected chip temperature exceeds the ascertained limit temperature.

9. The method as claimed in claim 8, further comprising a step (S4) for detecting a coolant temperature of a fluid via which the IGBT module (1) is cooled;
    wherein the step (S5) for ascertaining the limit temperature furthermore ascertains the limit temperature, using the detected coolant temperature.

10. The method as claimed in claim 8, wherein the limit temperature is ascertained using a previously determined set of characteristic curves.

* * * * *